(12) United States Patent
Murata

(10) Patent No.: US 6,809,597 B2
(45) Date of Patent: Oct. 26, 2004

(54) PHASE COMPARISON METHOD, PHASE COMPARISON CIRCUIT, AND PHASE LOCKED LOOP (PLL) TYPE CIRCUIT

(75) Inventor: Glenn Keiji Murata, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/400,105

(22) Filed: Mar. 26, 2003

(65) Prior Publication Data

US 2003/0184400 A1 Oct. 2, 2003

(30) Foreign Application Priority Data

Mar. 28, 2002 (JP) ......................................... 2002-092067

(51) Int. Cl.$^7$ ............................................. H03F 21/00
(52) U.S. Cl. ............................. 331/11; 331/16; 331/25; 331/175; 331/177 V; 331/177 R; 327/156; 327/159
(58) Field of Search ............................. 331/11, 25, 16, 331/177 V, 177 R, 175; 327/156, 159

(56) References Cited

U.S. PATENT DOCUMENTS

| | | | |
|---|---|---|---|
| 5,748,043 A | 5/1998 | Koslov | |
| 6,150,891 A | 11/2000 | Welland et al. | |
| 6,339,350 B1 | 1/2002 | Tanaka | |
| 2003/0197564 A1 * | 10/2003 | Humphreys et al. | .......... 331/16 |

FOREIGN PATENT DOCUMENTS

JP        355 149539 A    * 11/1980

OTHER PUBLICATIONS

Copy of the European Patent Office Search Report dated Jun. 12, 2003.

* cited by examiner

Primary Examiner—Michael B Shingleton
(74) Attorney, Agent, or Firm—Darryl G. Walker; Bradley T. Sako

(57) ABSTRACT

A phase comparison circuit for generating control voltages for a number of varactors of a phase locked loop (PLL) circuit has been disclosed. According to a particular embodiment, a number of phase difference detection circuits (101, 102 and 103) can be successively activated in response to a set of activation signals to generate output voltage signals (Vtunei). Output voltage signals (Vtunei) can vary according to an elapsed period time, and thus represent a phase difference. Each phase difference detection circuit (101, 102 and 103) can activate a trigger signal (Trg) when an internal voltage signal equals a predetermined value. A main signal (SIG) can be input as an activation signal to a first stage phase difference detection circuit (101). A trigger signal from a first stage phase difference detection circuit (101) can be input as an activation signal to a subsequent stage phase difference detection circuit (102). Phase difference detection circuits (101, 102 and 103) can be deactivated in response to an output signal (out) generated in response to a reference signal (REF), and provide output voltages (Vtunei) which can represent a phase difference between reference signal (REF) and a main signal (SIG).

20 Claims, 10 Drawing Sheets

PHASE COMPARISON METHOD, PHASE COMPARISON CIRCUIT, AND PHASE LOCKED LOOP (PLL) TYPE CIRCUIT

TECHNICAL FIELD

The present invention relates generally to phase comparison methods and/or circuits, and phase locked loop (PLL) type circuits, and more particularly to a phase comparison method and/or circuit, and phase locked loop (PLL) type circuit that can control the capacitance of varactors, or the like, in a voltage controlled oscillator (VCO).

BACKGROUND OF THE INVENTION

A phase locked loop (PLL) circuit typically includes a phase comparison circuit that can receive an input signal and feedback signal by way of a feedback loop. The feedback serves to adjust a frequency of the feedback signal to match that of the input signal. PLL circuits enjoy a wide variety of applications in various fields.

A PLL circuit can be considered "locked" when the phase comparison circuit indicates essentially no phase difference between the input signal and feedback signal, and/or when the phases of the input signal and feedback signal match one another, and maintain such a phase match.

A phase difference between an input signal and a feedback signal is detected by a phase comparison circuit. Such a phase difference can be translated into a voltage and applied to a variable capacitance element (a varactor), which may form part of resonator within a voltage controlled oscillator (VCO) in a later stage of the PLL circuit. A varactor provides a capacitance that varies in accordance with an applied voltage. Thus, in the above PLL arrangement, a varactor capacitance can reflect the phase difference between the input signal and the feedback signal.

A conventional technique that includes a phase comparison circuit for controlling a varactor is disclosed in U.S. Pat. No. 6,150,891 (hereinafter the '891 patent). The '891 patent shows a technique in which a plurality of signals are generated with a shift register, and such signals are applied to corresponding phase comparison circuits. FIG. 8 shows a conventional PLL circuit like that described in the '891 patent. In FIG. 8, a conventional PLL circuit includes a shift register circuit 200, a phase comparison circuit 201, a voltage controlled oscillator (VCO) 202, a frequency divider 203 having a frequency division ratio of N (an N-frequency divider), a frequency divider 204 having a frequency division ratio of Q (a Q-frequency divider), and a frequency divider 205 having a frequency division ratio of R (an R-frequency divider).

In the conventional arrangement of FIG. 8, a shift register 200 receives a signal SET as an input that is generated by frequency dividing an output signal $f_{out}$ by "N" within N-frequency divider 203. Shift register 200 may also receive a signal CLKQ at a clock input that is generated by frequency dividing an output signal $f_{OUT}$ by "Q" within Q-frequency divider 204. Shift register 200 may then output a number of predetermined signal SIGi (where i=0 to M) that are provided to phase comparison circuit 201.

Phase comparison circuit 201 includes M+1 phase difference detection circuits 210. Each of the phase detection circuits 210 receives as inputs, one of the signals SIGi and a reference signal REF. A reference signal REF is generated by frequency dividing an input reference signal $f_{REF}$ by "R" within R-frequency divider 205. Each phase detection circuit 210 can output a voltage signal to the VCO 202 that corresponds to a detected phase difference between their respective input signal SIGi and reference signal REF. A VCO 202 can change capacitance values of varactors of a resonator according to voltage signals received from phase detection circuits 210. Such changes in varactor capacitance values can control the oscillation frequency of output signal $f_{OUT}$. The PLL circuit of FIG. 8 can be considered locked when the frequency of output signal $f_{OUT}$ matches that of reference signal $f_{REF}$.

FIG. 9 sets forth a timing chart that illustrates the operation of a phase comparison circuit 201. FIG. 10 is a diagram illustrating the configuration of a phase difference detection circuit 210. The operation of a phase comparison circuit 201 will now be described with reference to FIGS. 8, 9 and 10. As noted above, a conventional phase comparison circuit 201 can include "0–M" phase difference detection circuit 210. Thus, if M=2, a phase comparison circuit 201 includes three phase difference signals that receive signals SIGi as inputs (where i=0 to M), respectively.

Referring to FIG. 10, conventional phase difference detection circuit 210 can receive a signal SIG0 as an input. A conventional phase difference detection circuit 210 includes a voltage source $V_{nom}$ for generating a predetermined initial potential, a logical sum circuit AND0, capacitors C0a and C0b, a resistor R0, and three switches SW0a, SW0b, and SW0c. It is understood that switches SW0a, SW0b and SW0c are operated to not close at the same time. In addition, an output node N0 can be connected to a capacitor C0a, and provide an output voltage to a VCO. Each of the 0-M phase difference detection circuits 210 receiving a signal SIGi can have the same general configuration as that of FIG. 10, except for the particular input signal received.

A shift register 200 receives as inputs the signals CLKQ and SET. The signal CLKQ is obtained by frequency-dividing output signal $f_{out}$ by Q and the signal SET is obtained by frequency dividing output signal $f_{out}$ by N. According to such input signals, shift register 200 generates signals SIGi as outputs. Frequency division ratios N and Q of frequency dividers 203 and 204, respectively, are set to meet the relationship N>Q. Thus, the cycle of signal CLKQ can be shorter than that of signal SET. Further, signals SIGi generated by shift register 200 rise concurrently with the rise of signal SET and fall later than the fall of signal SET by i cycles of the signal CLKQ, respectively. Thus, signals SIGi have the timing as set forth in FIG. 9.

While a signal SET is at a high level, a phase difference detector 210 supplies the potential of capacitor C0b to capacitor C0a by way of switch SW0a. Such a potential can represent a phase detection result for a previous cycle. In this way, a potential corresponding to a phase detection operation can be presented at node N0.

Switch SW0b may then close to charge capacitor C0b with an initial potential Vnom. In this way an initial potential can be established on capacitor C0b.

Upon the fall of a signal SET, an AND gate AND0 may close according to the logical combination of the signal REF and SIG0. That is, switch SW0c will close in the time period that signals REF and SIG0 are both high. If switch SW0c is closed, electric charge from capacitor C0b will discharge to ground through resistor R0. Thus, the initial potential of capacitor C0b can be discharged for a time period corresponding to a phase difference between the signal REF and SIG0. In this way, a potential corresponding to a phase difference can be established on capacitor C0b.

In the particular example of FIG. 9, the signal SIG0 falls before the rise of signal REF. Thus, there is no period time after the signal SET falls during which signals REF and SIG0 are both high. Consequently, switch SW0c remains open, and essentially no charge on capacitor C0b is discharged through resistor R0.

From the above description it is understood that each phase difference detection circuit 210 closes a switch SWic (where i=0–M) for a period of time corresponding to a phase difference between one of the signals SIGi and REF. In particular, each phase difference detection circuit can detect the time between the rise of signal REF and the fall of signal SIGi, and discharge a capacitor Cib during such a time period. As noted previously, the potential established across capacitor Cib is supplied to corresponding capacitor Cia when signal SET rises once again to a high level.

FIG. 11 shows changes in voltage due to a discharge of capacitors Cib that corresponds to the timing of FIG. 9. Potentials at output nodes Ni of phase comparison circuit 210 are indicated by black circles in FIG. 11. As shown, output node N0, corresponding to the case where signal SIG0 falls before the rise of signal REF, can have the potential Vnom, as capacitor C0b is not discharged because switch SW0c is not turned on. The potential at node N1 is lower than that of N0 by an amount corresponding to the difference between the point at which signal REF rises and signal SIG1 falls. The potential appearing on subsequent nodes have time difference values shifted by one clock cycle (Δt) of signal CLKQ.

Output voltages of the phase difference detection circuits 210 can control varactors connected in parallel within VCO 202. If the capacitance of such varactors is given by Ci, then a total capacitance ΣC (composite capacitance) of the parallel-connected varactors can be as follows:

ΣC=C0+C1+... +CM.

The VCO 202 can oscillate at a resonance frequency determined by the composite capacitance ΣC. In this way, an output frequency $f_{OUT}$ can be altered in response to a phase difference between signal SET and signal REF. When the frequency of signal REF essentially equals that of the signal SET, the PLL circuit can be considered locked.

Conventionally, a capacitance presented by a varactor can have a non-linear relationship to an applied control voltage. This can lead to drawbacks in PLL operation. In particular, if a range of phase adjustment within a PLL is large, characteristics of the oscillation frequency of VCO 202 can be deteriorated. In the above-described conventional PLL circuit, capacitance values of individual varactors are controlled by corresponding phase difference detection circuits 210. As a result, the characteristics of a resulting composite capacitance ΣC versus a phase difference can be more linear as the number varactors provided within VCO 202 is increased. Thus, frequency characteristics of a VCO 202 can be enhanced by increasing the number of varactors.

However, in the above-mentioned conventional PLL circuit, individual varactors are controlled in a parallel number by a corresponding signals SIGi generated by a shift register 200. Thus, if a frequency characteristic is to be improved by increasing the number of varactors, a shift register 200 has to be increased in scale to generate such additional signals. This can undesirably increase circuit size and current consumption for the PLL circuit.

In addition, in the conventional approach signals SIGi have edges that are shifted within shift register 200 according to clock signal CLKQ. However, such signals SIGi all need to fall prior to a subsequent rise in signal SET. Thus, an increase in the number of signals SIGi can require a shorter cycle for clock signal CLKQ. When the clock signal CLKQ is generated by frequency dividing the output signal of VCO 202, a frequency divider (e.g., Q frequency divider 204) can be required to have a small frequency division ratio. This can also increase circuit scale and power consumption.

Thus, as is understood from above, as the number of varactors is increased, it is possible to enhance the frequency characteristics of the VCO 202 with respect to a detected phase difference. However, in a conventional approach, increasing the number of varactors requires an increase in the number of corresponding phase difference detection circuits 210. Increasing the number of phase difference detection circuits 210 requires reconfiguring the shift register 200 to increase the number of output signals SIGi that are generated.

In light of the above, it would desirable to provide a phase comparison method, phase comparison circuit, and/or PLL circuit having a number of varactors that are individually controlled, but not suffer from increased circuit scale and power consumption presented by conventional approaches. It would also be desirable to provide such a phase comparison method, phase comparison circuit, and/or PLL circuit, in which the number of varactors may be readily increased without the drawbacks of conventional approaches.

SUMMARY OF THE INVENTION

The present invention may include a method of generating phase comparison signals depending on the phase relationship between a first signal and a second signal. The method may include: (a) generating a first voltage signal of a predetermined sequence that has a value that depends on a time elapsed from the activation of the first signal, and activating a first trigger signal of the sequence if the first voltage signal exceeds a threshold limit; (b) generating at least one subsequent voltage signal of the sequence that has a value which depends on a time elapsed from the activation of a previous trigger signal of the sequence; and (c) activating at least one subsequent trigger signal of the sequence if the at least one subsequent voltage signal exceeds a threshold limit. The method may further include outputting the first voltage signal and the at least one subsequent voltage signal as phase comparison signals in response to the second signal.

According to one aspect of the embodiments, a step (a) can include activating a first of a plurality of voltage signal generating circuits in the sequence, a step (b) can include activating a subsequent voltage signal generating circuits of the sequence, and a step (c) can include deactivating all of the voltage signal generating circuits.

According to another aspect of the embodiments, the method may further include a step (d) providing the first and at least subsequent voltage signals to corresponding varactors that each generate a corresponding capacitance, the corresponding capacitances being arranged in parallel.

According to another aspect of the embodiments, the method may further include a step (e) generating an oscillating signal with a voltage controlled oscillator that includes the parallel connected capacitances, a frequency of the oscillating signal corresponding to the variable capacitance of the parallel connected capacitances.

According to another aspect of the embodiments, a step (a) can include discharging a first capacitor to generate the first voltage signal, and activating the first trigger signal if the first voltage signal falls below the threshold limit. In addition, a step (b) can include discharging a subsequent capacitor to generate the subsequent voltage signal, and activating the subsequent trigger signal if the subsequent voltage signal falls below the threshold limit.

According to another aspect of the embodiments, a step (a) can include charging a first capacitor to generate the first voltage signal, and activating the first trigger signal if the first voltage signal rises above the threshold limit. In addition, a step (b) can include charging a subsequent capacitor to generate the subsequent voltage signal, and activating the subsequent trigger signal if the subsequent voltage signal rises above the threshold limit.

According to another aspect of the embodiments, a step (c) can include transferring the first voltage signal from a first dischargeable capacitor to a first output capacitor, and transferring the subsequent voltage signal from a subsequent dischargeable capacitor to a subsequent output capacitor.

According to another aspect of the embodiments, the predetermined sequence can be greater than two. Step (b) can generate a second subsequent voltage signal of the sequence. In addition, step (b) can be repeated to generate a third subsequent voltage signal of the sequence.

The present invention may also include a phase comparison circuit for generating phase comparison signals according to a phase relationship between a first signal and a second signal. The phase comparison circuit can include a plurality of voltage signal generation circuits that are each activated in response to corresponding activation signals to generate a voltage signal with a value that depends on a time elapsed from the activation of the corresponding activation signal, and to activate a trigger signal if the voltage signal exceeds a predetermined limit. The voltage signal generating circuits can have a sequence with a subsequent voltage signal generating circuit being activated in response to the trigger signal of the previous voltage signal generating circuit of the sequence, and the first voltage signal generating circuit of the sequence being activated in response to the first signal. In addition, the voltage signal generating circuits can be deactivated in response to the second signal, and the voltage signals of the voltage signal generating circuits can be output as phase comparison signals.

Such an arrangement can dispense with the need to generate different timing signals for multiple voltage signal generation circuits, as the embodiments can include sequential activation of such circuits. Thus, it can be possible to reduce circuit size and power consumption over conventional approaches. In addition or alternatively, it can be possible to increase the number of voltage signal generation circuits without having to increase the size of a signal generation circuit, such as a shift register, as is done in conventional approaches.

According to one aspect of the embodiments, each voltage signal generating circuit can include a capacitor having a potential that is set to a predetermined value prior to the activation of the corresponding activation signal. The potential may then be altered in response to the activation of the corresponding activation signal. The potential may also be output as the voltage signal of the voltage signal generating circuit.

According to another aspect of the embodiments, the phase comparison circuit may also include a signal generation circuit that generates a sample signal followed by a charge signal followed by a deactivation signal. In addition, each voltage signal generating circuit can set the capacitor potential to a predetermined value in response to the sample signal. Such a potential can be altered in response to a charge signal and output in response to a deactivation signal.

According to another aspect of the embodiments, a signal generation circuit can receive a clock signal and generate a sample signal "a" clock cycles after the activation of the first signal, generate a charge signal "b" cycles after the activation of the first signal, and generate a deactivation signal "c" cycles after the activation of the first signal. Such clock signal values can have the relationship: c>b>a.

According to another aspect of the embodiments, a phase comparison circuit can also include a plurality of variable capacitance capacitors (varactors) connected in parallel with one another. Such varactors can have capacitance values that vary according to the phase comparison signals. In addition, a voltage controlled oscillator can generate an output signal that oscillates at a frequency which depends upon the parallel connected varactors.

Thus, even in an arrangement where such variable capacitance capacitors are individually controlled, the number of such variable capacitance capacitors can be increased without necessarily increasing circuit size or power consumption. Such a result can be possible as a shift register, or the like, does not have to be modified to generate additional control signals, due to the sequential activation of the voltage signal generating circuits.

According to another aspect of the embodiments, each voltage signal generating circuit can include a sample capacitor coupled to a voltage node by a first switch, a reset capacitor coupled to the voltage node and to a first potential by a second switch, a resistance coupled to the voltage node and to a second potential by a third switch, and a logic circuit having an input coupled to the voltage node and an output that generates the trigger signal.

The present invention may also include a phase locked loop circuit that includes a plurality of phase difference detection circuits. Each phase difference detection circuit can include an enable input, and can generate an output voltage signal and a trigger signal. The output voltage signal can vary according to a time difference between the activation of an enable signal at the enable input and a termination signal. Such a termination signal can be common to the phase difference detection circuits. In addition, a trigger output of one phase difference detection circuit being coupled to the enable input of another phase difference detection circuit.

According to one aspect of the embodiments, a phase locked loop circuit can also include a voltage controlled oscillator (VCO) that varies an output signal frequency according to values received at a plurality of control inputs. In addition, each output voltage signal can be coupled to one of the VCO control inputs.

According to another aspect of the embodiments, such VCO control inputs can provide control voltage values to varactors.

According to another aspect of the embodiments, each phase difference detection circuit can include a first switch that couples a reset capacitor first node to an output capacitor first node, a second switch that couples a first voltage to the reset capacitor first node, and a third switch that enables a current path to the reset capacitor first node.

According to another aspect of the embodiments, a phase locked loop circuit can also include a signal generator circuit that activates a sample pulse followed by a reset pulse followed by an end pulse. In addition, each phase difference detection can include a first switch being activated by the sample pulse, a second switch being activated by the reset pulse, and third switch being activated by a logical combination of the end pulse and the signal received at an enable input.

According to another aspect of the embodiments, a signal generator circuit can activate a sample pulse a first number of clock cycles following the activation of a reference signal, can activate a reset pulse a second number of clock cycles following the activation of a reference signal, and can activate an end pulse a third number of clock cycles following the activation of a reference signal. Such a third number can be greater than the second number and the second number can be greater than the first number.

DETAILED DESCRIPTION OF THE EMBODIMENTS

The present invention will hereinafter be described in more detail on the basis of various particular embodiments with reference to accompanying figures.

Figure 1:
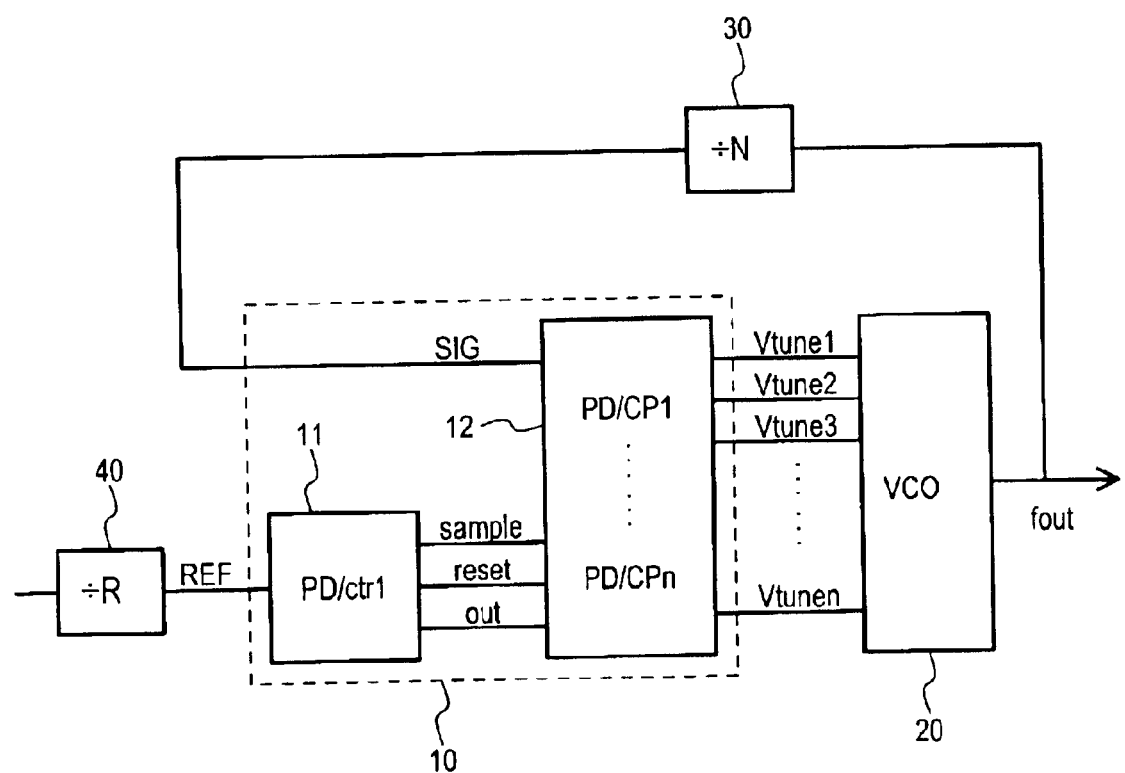
FIG. 1 is a block diagram of a phase locked loop (PLL) circuit according to one embodiment of the present invention.

FIG. 1 is a block diagram showing a phase locked loop (PLL) circuit according to one embodiment of the present invention. A PLL circuit can include a phase comparison circuit 10, a voltage controlled oscillator (VCO) 20, a frequency divider 30 having a frequency division ratio of N (N-frequency divider), and a frequency divider 40 having a frequency division ratio of R (R-frequency divider). A phase comparison circuit 10 can include a phase comparison control unit 11 and a phase difference detection unit 12, and can provide output voltages Vtunei (where i=0 to n). VCO 20 can include a plurality of varactors (not shown) that are controlled by corresponding output voltages Vtunei from phase comparison circuit 10.

The PLL circuit of FIG. 1 provides an output signal $f_{OUT}$ in response to a periodic input signal received by R-frequency divider 40. The PLL circuit of FIG. 1 includes a feedback loop that can frequency divide output signal $f_{OUT}$ of VCO 20 by N to generate a main signal SIG. Main signal SIG can be provided as one input to phase comparison circuit 10. In addition, R-frequency divider 40 can generate a reference signal REF, which can be provided as another input to phase comparison circuit 10.

A plurality of varactors within VCO 20 can form a resonator. Capacitance values presented by such varactors are controlled to thereby vary an oscillation frequency of output signal $f_{OUT}$ provided by VCO 20. Varactors within VCO 20 can be arranged in parallel, thus presenting a composite capacitance that establishes a resonant frequency for VCO 20.

Figure 2:
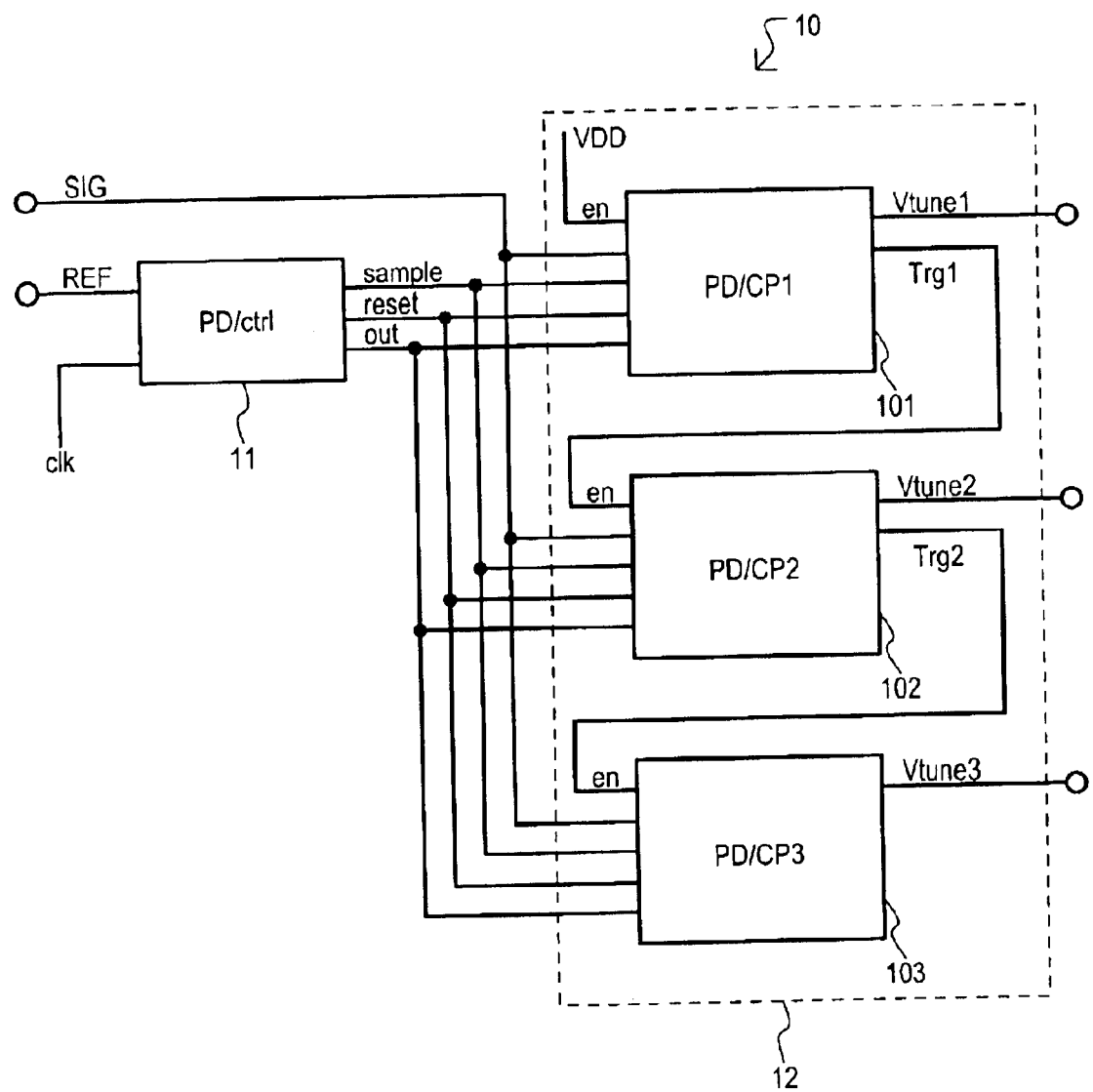
FIG. 2 is a block diagram of a phase comparison circuit that may be used in a PLL circuit like that of FIG. 1.

FIG. 2 shows one example of a phase comparison circuit according to one embodiment. Such a phase comparison circuit can correspond to that shown as item 10 in FIG. 1, and so will be referred to by the same reference character. A phase comparison circuit 10 can include a phase comparison control unit (PD/ctrl) 11 that can include a shift register, as well as a phase difference detection unit 12 that includes "n" phase difference detection circuits (PD/CPi, where i=1 to n). A value "n" can be an integral number equal to or greater than 2. Phase comparison circuit 10 can receive as inputs a reference signal REF and main signal SIG, and output voltage signals Vtune1 to Vtunen. Output voltage signals Vtune1 to Vtunen have values corresponding to a phase difference between reference signal REF and main signal SIG. FIG. 2 shows an example of phase comparison circuit 10 in which n=3. As a result, phase difference detection unit 12 can include a phase difference detection circuit 101 in a first stage, a phase difference detection circuit 102 in a second stage, and a phase difference detection circuit 103 in a third stage. Such stages can represent a sequence in which voltage signals can be generated and phase difference circuits can be activated.

In addition to reference signal REF and main signal SIG, a phase comparison control unit 11 may also receive a clock signal "clk" as an input. A clock signal clk can be a periodic signal having a shorter cycle than that of reference signal REF. Such a clock signal clk can be utilized by phase comparison control unit 11 to output signals "sample", "reset", and "out". A sample signal can have a leading edge that is delayed by one cycle of the clock signal clk with respect to an edge (e.g., a rising edge) of reference signal REF. A reset signal can have a leading edge that is delayed by "b" cycles of the clock signal clk with respect to the edge of reference signal REF. The out signal can have a leading edge that is delayed by "c" cycles of the clock signal clk with respect to the edge of reference signal REF. The sample signal, reset signal and out signal rise in the above recited order (sample signal first, reset signal second, out signal third), all within one period of the reference signal REF. Further, each of the sample, reset, and out signals falls before the next signal in the order rises. Still further, the out signal will fall before a leading edge of the next reference signal REF cycle.

Phase difference detection circuits 101, 102 and 103 can be voltage generation circuits that receive as inputs the main signal SIG, a sample signal, a reset signal, an out signal, and an enable signal "en". Phase difference detection circuits 101, 102 and 103 can output voltage signals Vtunei (i=1 to n) and trigger signals Trgi. As noted above, n=3 in the particular example of FIG. 2.

Phase difference detection circuit 101 of a first stage can receive as its enable signal en a voltage signal VDD. A voltage signal VDD can be high at all times the circuit is operating. Phase difference detection circuit 102 of a second stage can receive as its enable signal en a trigger signal Trg1 generated by phase difference detection circuit 101 of a previous (first) stage of a sequence. Phase difference detection circuit 103 of a third stage can receive as its enable signal en a trigger signal Trg2 generated by phase difference detection circuit 102 of a previous (second) stage of the sequence.

Figure 3:
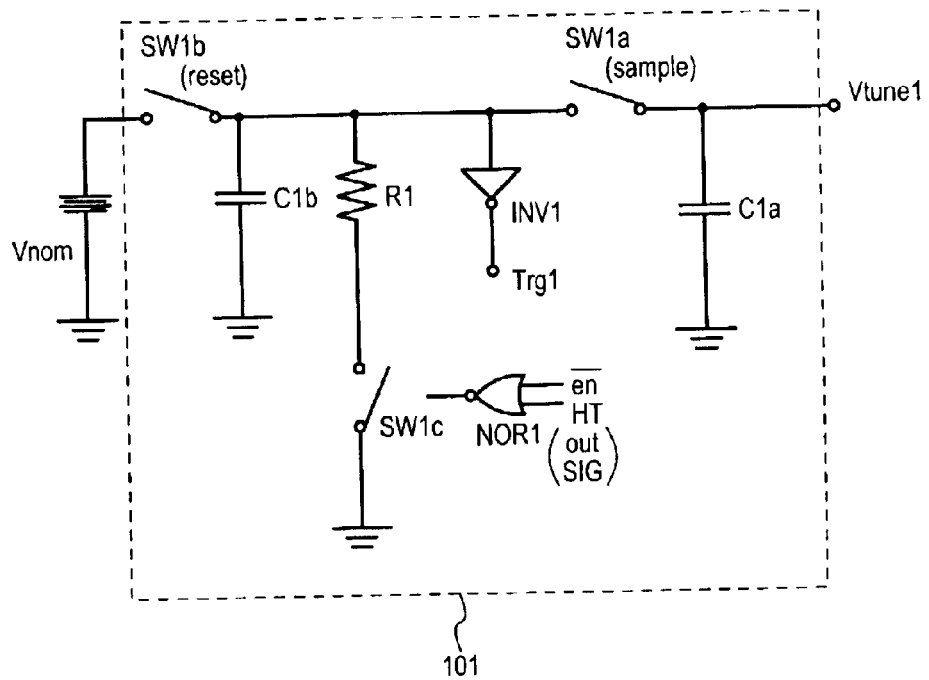
FIG. 3 is a circuit diagram showing a phase difference detection circuit that may be used in a phase comparison circuit like that of FIG. 2.

FIG. 3 shows one example of a phase difference detection circuit according to one embodiment. A phase difference detection circuit 101 can include an inverter INV1, switches SW1a, SW1b and SW1c, potential holding capacitors C1a and C1b, and a logic gate. In the particular embodiment of FIG. 3, the logic gate can be a negative OR circuit (NORi) that includes two inputs.

A switch SW1a can be operated in response to a sample signal to thereby supply the potential of potential holding capacitor C1b to potential holding capacitor C1a. A switch SW1b can be operated in response to a reset signal to thereby provide an initial potential Vnom to potential holding capacitor C1b. A switch SW1c can be operated in response to an output of logic gate NOR1, which may receive an inverted enable signal "en" and a logic signal HT as inputs. When activated, switch SW1c can discharge electric charge accumulated in potential holding capacitor C1b through resistor R1.

A logic signal HT can go low for a period of time between when main signal SIG is low and an out signal transitions high. A transition high of the out signal can essentially terminate the low-going portion of logic signal HT. An inverter INV1 can receive an input potential from potential holding capacitor C1b. If such an input potential is lower than a threshold voltage Vth of inverter INV1, the inverter INV1 can output a signal Trg1 having a high level. If an input potential is greater than a threshold voltage Vth of inverter INV1, the inverter INV1 can output a signal Trg1 having a low level. Signal Trg1 can be provided as an enable signal "en" to a phase difference detection circuit of a next stage (e.g., 102) of a sequence.

Figure 4:
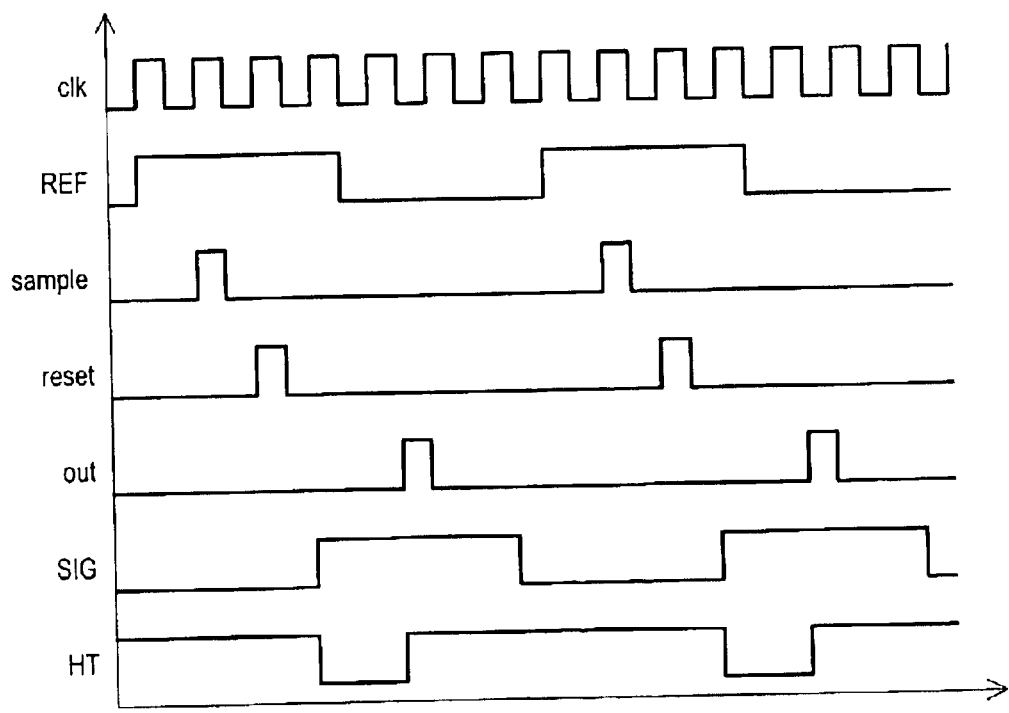
FIG. 4 is a timing chart showing the response of signals input to and generated by a phase comparison circuit.

FIG. 4 sets forth a timing diagram showing signals that may be received and generated within a phase comparison circuit 10. The operation of a phase comparison circuit 10 will now be described with reference to FIGS. 1–4. Phase difference detection circuits 102 and 103 can have the same general configuration as phase difference detection circuit 101. Thus, the operation of phase difference detection circuits 102 and 103 will be understood from a description of the phase difference detection circuit 101.

Phase comparison control unit 11, as described above, can generate a sample signal, a reset signal, and an out signal. A sample signal can rise "a" clock cycles (e.g., a=1) after reference signal REF rises (the clock cycles being those of clock signal clk). A reset signal can rise "b" clock cycles after reference signal REF rises. An out signal can rise "c" clock cycles (e.g., a=1) after reference signal REF rises. Values of such a clock cycle delays may have the relationship of c>b>a. In addition, the out signal can rise prior to a subsequent rise in the reference signal REF.

Following a rise in reference signal REF, after "a" clock cycles, a sample signal can rise, closing a switch SW1a as set forth in FIG. 3. Closing switch SW1a can result in the potential of potential holding capacitor C1b, determined in a previous cycle of reference signal REF, being transferred to potential holding capacitor C1a. Upon the fall of the sample signal, switch SW1a can be opened, thereby fixing a potential at potential holding capacitor C1a.

Next, "b" clock cycles after reference signal REF rises, a reset signal can rise. When a reset signal rises, switch SW1b can be closed for a period of time to supply an initial potential Vnom (e.g., Vnom=VDD) to potential holding capacitor C1b.

Next, assuming that a main signal SIG rises before an out signal (i.e., rises sooner than "c" clock cycles after reference signal REF rises), a signal HT can transition low. A signal HT can be provided as one input to logic gate NOR1.

It will be recalled that an enable signal for a first stage phase difference detection circuit 101 can be at a high level VDD. Thus, a low inverted enable signal can be provided as a second input to logic gate NOR1. With two low input signals, logic gate NOR1 can provide a high output signal. Such a high output signal can close switch SW1c for a period of time. When switch SW1c closes, potential holding capacitor C1b can discharge through resistor R1 until signal HT returns to a high level.

Phase difference detection circuits 102 and 103 of the second and third stages, respectively, can each include a logic gate (e.g., NOR2 and NOR3). Further, such logic gates (NOR2 and NOR3) may each receive a signal HT as an input. However, the outputs of such logic gates (NOR2 and NOR3) can remain low, as their corresponding enable inputs "en" can be low.

Assuming signal HT stays low for a sufficient time period, a potential holding capacitor C1b can discharge to a potential below the threshold voltage Vth of inverter INV1. As a result, trigger signal Trg1 can go high.

Phase difference detection circuit 102, in the second stage, can receive a trigger signal Trg1 as an enable input. Thus, if trigger signal Trg1 is high, a low inverted enable signal can be provided as a second input to a logic gate NOR2 (not shown). Because the other input (HT) of such a logic gate NOR2 is already low, the output of logic gate NOR2 can go high. This can close a switch SW2c (not shown), which can discharge a potential holding capacitor C2b (not shown) within phase difference detection circuit 102.

Still further, if a potential of potential holding capacitor C2b falls below a threshold voltage Vth of an inverter INV2 in phase difference detection circuit 102, inverter INV2 can output a high trigger signal Trg2.

Phase difference detection circuit 103, in the third stage, can receive a trigger signal Trg2 as an enable input. Thus, if trigger signal Trg2 is high, a low inverted enable signal can provided as a second input to a logic gate NOR3 (not shown). Because the other input (HT) of such a logic gate NOR3 is already low, the output of logic gate NOR2 can go high. This can close a switch SW3c (not shown), which begin discharging potential holding capacitor C3b (not shown) within phase difference detection circuit 103.

When the out signal rises, signal HT can return to a high level. Within phase difference detection circuits 101, 102, and 103, switches SW1c, SW2c, and SW3c, respectively, can open. As a result, a potential can be established on potential holding capacitors C1b, C2b and C3b that reflects a phase difference between main signal SIG and the out signal (and hence a phase difference between the main signal SIG and reference signal REF).

Upon a subsequent rise in reference signal REF, potentials on potential holding capacitors C1b, C2b and C3b are supplied to potential holding capacitors C1a, C2a and C3a, respectively. Voltages on such potential holding capacitors C1a, C2a and C3a can be output as output voltages Vtune1, Vtune2, and Vtune3, respectively.

Figure 5:
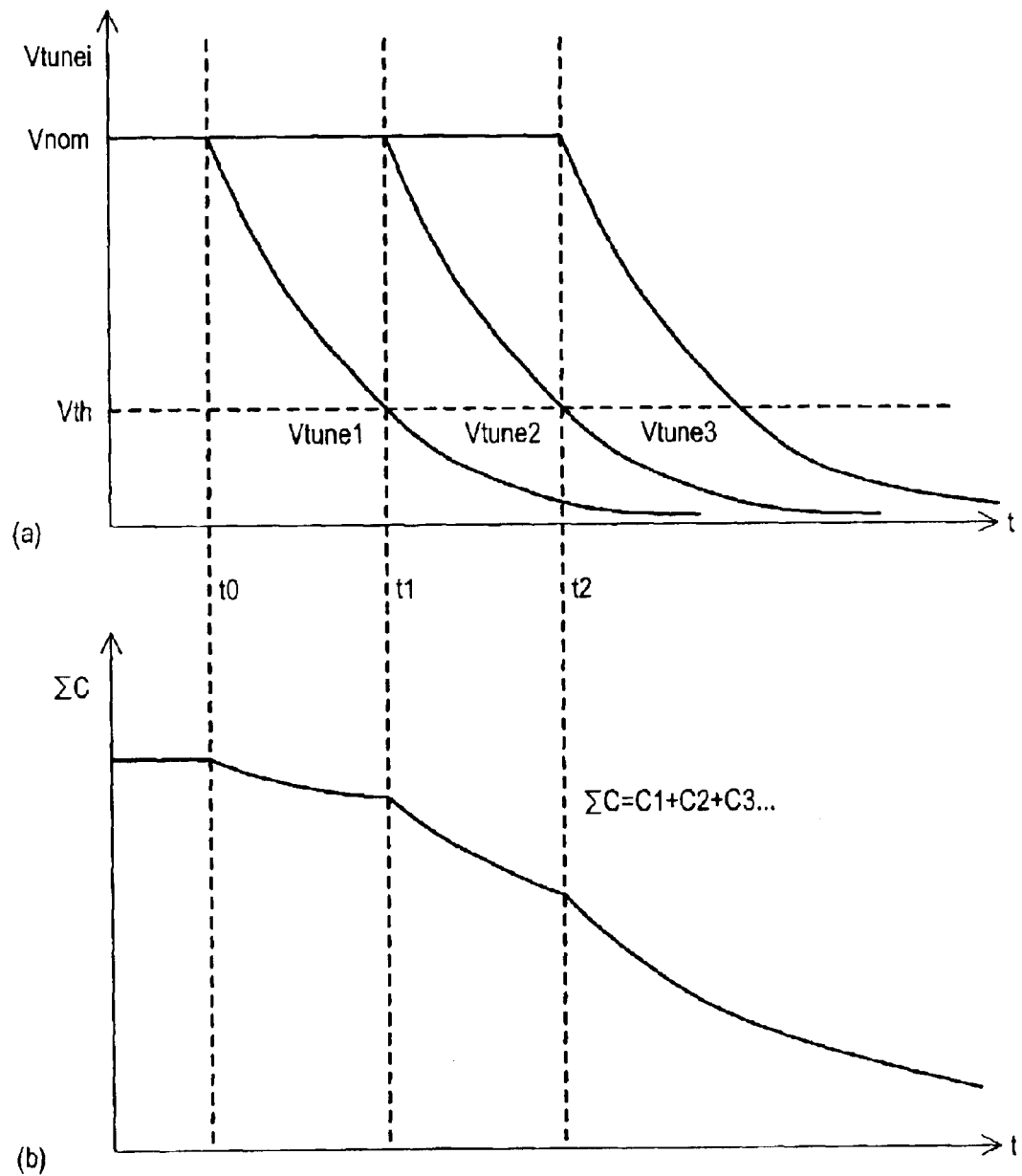
FIG. 5(a) is a timing diagram showing changes in output voltage corresponding to a phase difference for a phase difference detection circuit according to one embodiment.
FIG. 5(b) is a timing diagram showing changes in a composite capacitance of varactors corresponding to a phase difference for a voltage controlled oscillator according to one embodiment.

FIGS. 5(a) and 5(b) show one example of a relationship between a phase difference of a main signal SIG versus a reference signal. In particular, FIG. 5(a) shows output voltages Vtunei versus a time at which main signal SIG rises with respect to the out signal. FIG. 5(b) shows a resulting composite capacitance ΣC versus the same time difference. Composite capacitance ΣC can be provided by varactors within VCO 20.

Referring now to FIGS. 5(a) and 5(b), assuming that main signal SIG rises at time t0, a potential holding capacitor C1b, previously charged to a nominal potential (e.g., VDD), can begin to discharge through a resistor R1 and drop in potential. Potential holding capacitor C1b can generate an output voltage Vtune1.

As the potential of potential holding capacitor C1b falls lower than a threshold voltage Vth of an inverter INV1 at time t1, a potential holding capacitor C2b can begin discharging through a resistor R2, and drop in potential. Potential holding capacitor C2b can generate an output voltage Vtune2.

Still further, as the potential of potential holding capacitor C2b falls lower than a threshold voltage Vth of an inverter INV2 at time t2, a potential holding capacitor C3b can begin discharging through a resistor R3. Potential holding capacitor C3b can generate an output voltage Vtune3.

From the above, it is understood that a threshold voltage Vth can determine an average gradient over a provided range of variable capacitance. Further, a gradient can be made smaller by providing a lower threshold voltage Vth. In this way, a variable capacitance can be provided by successively discharging a number of potential holding capacitors (e.g., C1b, C2b and C3b).

Referring still to FIGS. 5(a) and 5(b), when an out signal rises between times t0 and t1, the following output voltages are provide Vtune2=Vtune3=VDD. Thus, only output voltage Vtune1 is provided as an adjusted control voltage for a VCO 20. When an out signal rises between times t1 and t2, Vtune3=VDD. Thus, output voltages Vtune1 and Vtune2 are provided as adjusted control voltages for VCO 20. Finally, when an out signal rises after time t2, all three output voltages Vtune1, Vtune2 and Vtune3 can be provided as adjusted control voltages to a VCO 20. In other words, the number of phase difference detection circuits (e.g., 101, 102 and 103) that provide an adjusted output voltage depends on the period of time corresponding to the phase difference between main signal SIG and an out signal.

As described above, varactors provided within VCO 20 can be connected in parallel with one another. Thus, assuming that the capacitance provided by each of "i" varactors can be controlled by a corresponding output voltage Vtunei, a composite capacitance can be given by the following relationship:

$$\Sigma C = C1 + C2 + C3 + \ldots + Ci.$$

FIG. 5(b) shows one example of the relationship between a phase difference of signal SIG and an out signal versus a composite capacitance ΣC.

Figure 6:
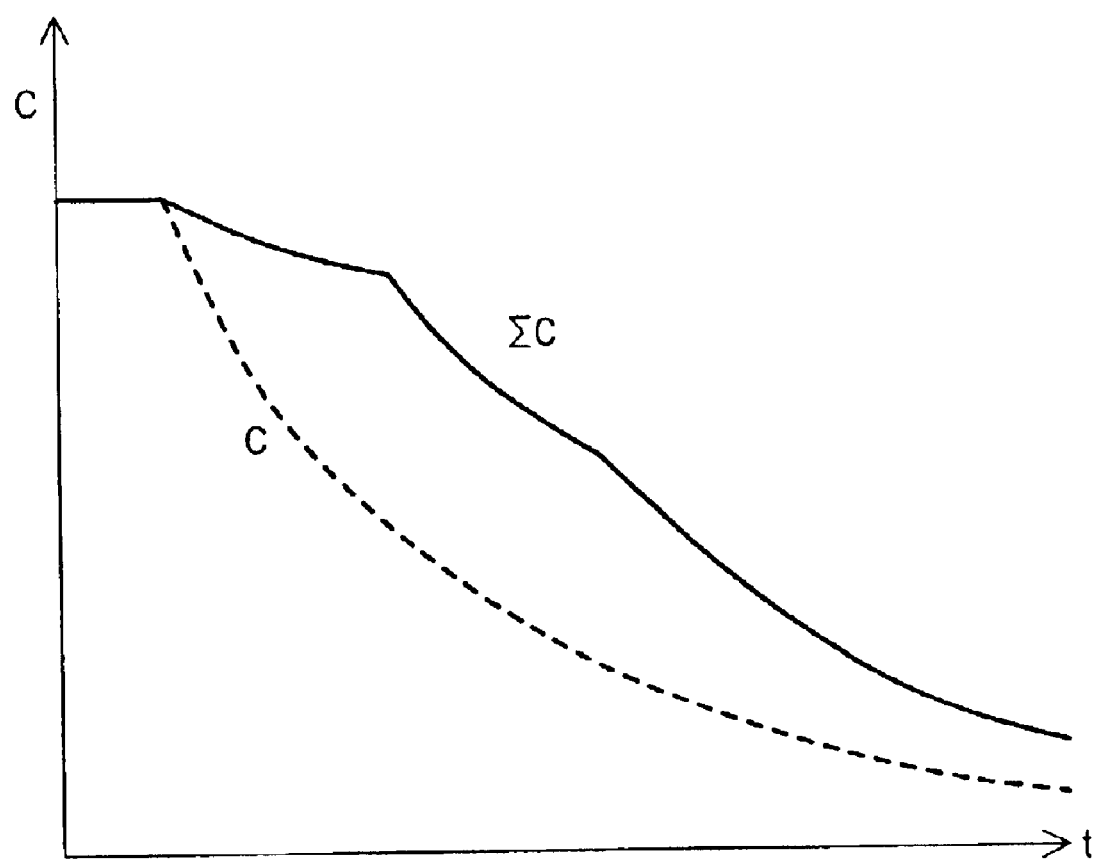
FIG. 6 is a graph showing a composite capacitance versus a phase difference according to one embodiment.

FIG. 6 shows another example of a resulting composite capacitance ΣC versus a phase difference between a main signal SIG and an out signal. In FIG. 6; a solid line indicates a composite capacitance ΣC result like that shown in FIG. 5(b). A dotted line indicates a capacitance of a single varactor for the same range as that of the composite capacitance ΣC. It is known that a capacitance of a varactor can be non-linear. In particular, a varactor capacitance can be in proportion to a control voltage to a minus half power (or minus one third power). However, by connecting a number of varactors in parallel and continuously controlling their capacitance values, a resulting gradient for such capacitance values can be averaged, thereby reducing non-linearity in the response.

In a phase comparison circuit according to an embodiment of the present invention, a number of varactors can be controlled individually to improve a response for a composite capacitance ΣC versus a phase difference between a main signal SIG and an out signal. Thus, if a phase comparison circuit according to the present invention is implemented in a PLL circuit, the frequency characteristics of a VCO of the PLL circuit can be enhanced over conventional approaches.

In addition, according to particular embodiments, potential holding capacitors may be activated in a cascaded fashion (e.g., according to a sequence), and not in response to individual input signals. In particular, when a potential of a potential holding capacitor in a phase detection circuit of one stage falls below a threshold voltage, a phase detection circuit in a next stage can be activated. Thus, the number of varactors can be increased without corresponding increases in circuit scale and/or current consumption that can occur with conventional approaches.

Figure 7:
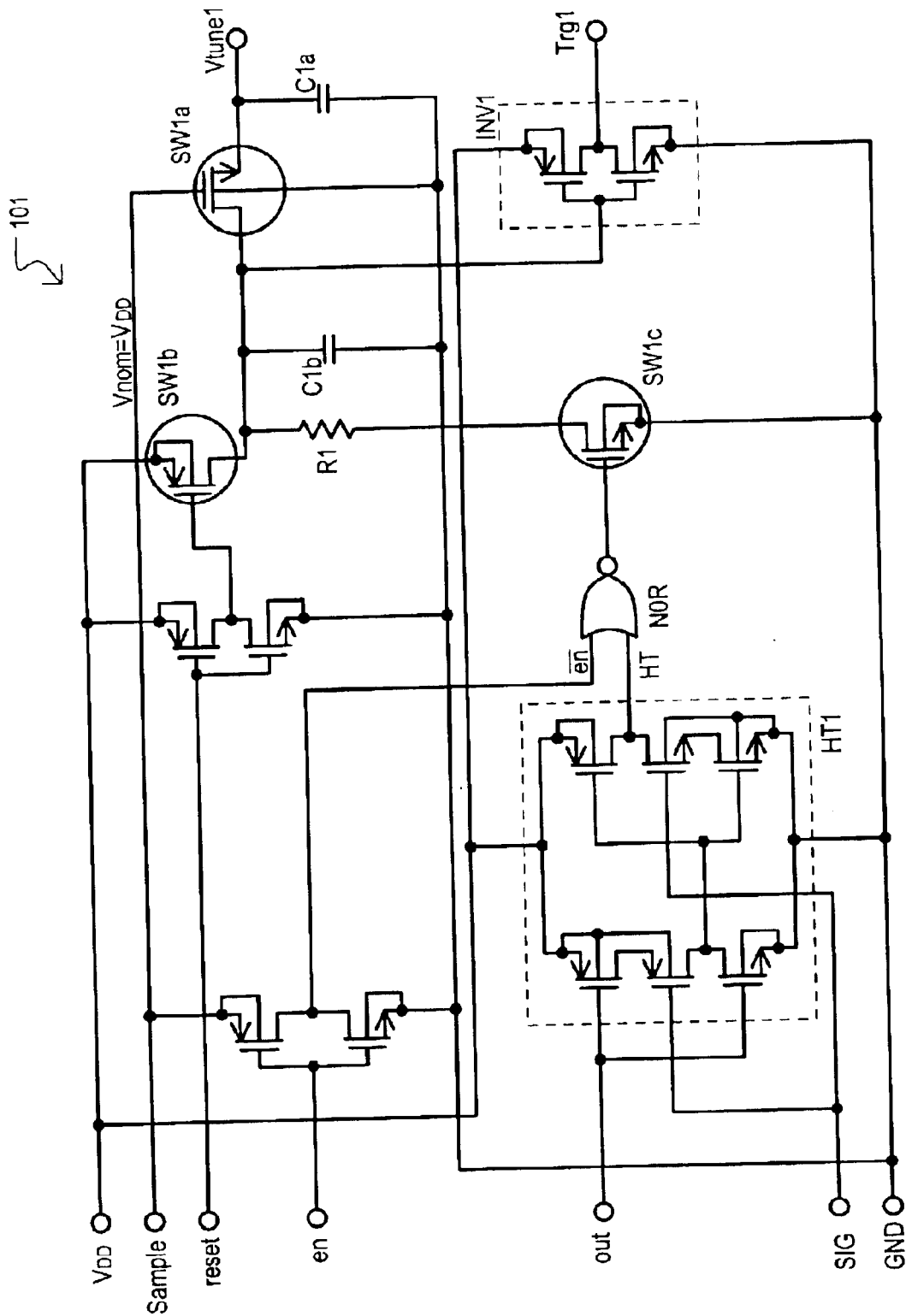
FIG. 7 is a circuit diagram showing a detailed example of a phase difference detection circuit like that of FIG. 2.
Figure 8:
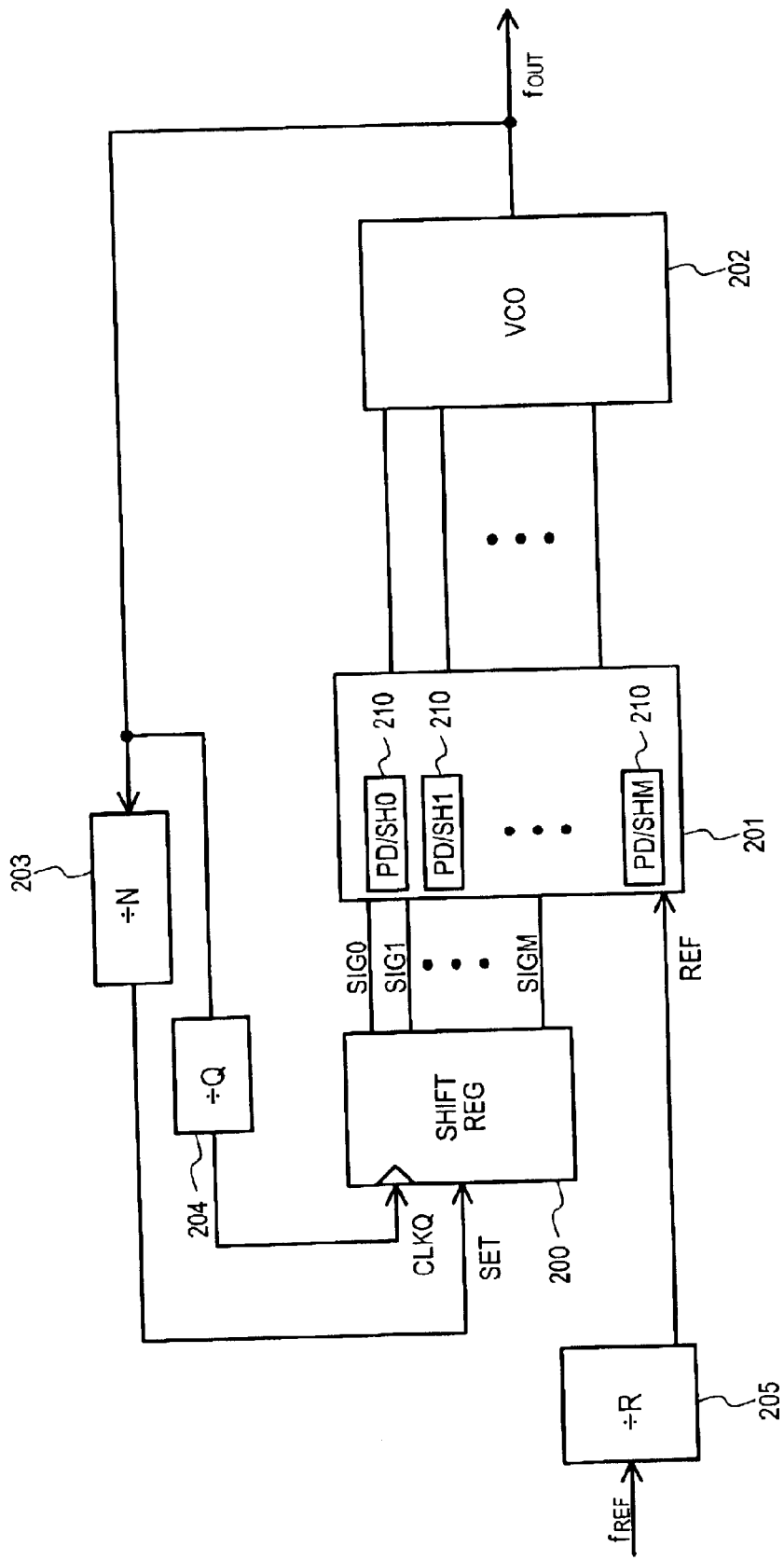
FIG. 8 is a block diagram of a conventional PLL circuit.
Figure 9:
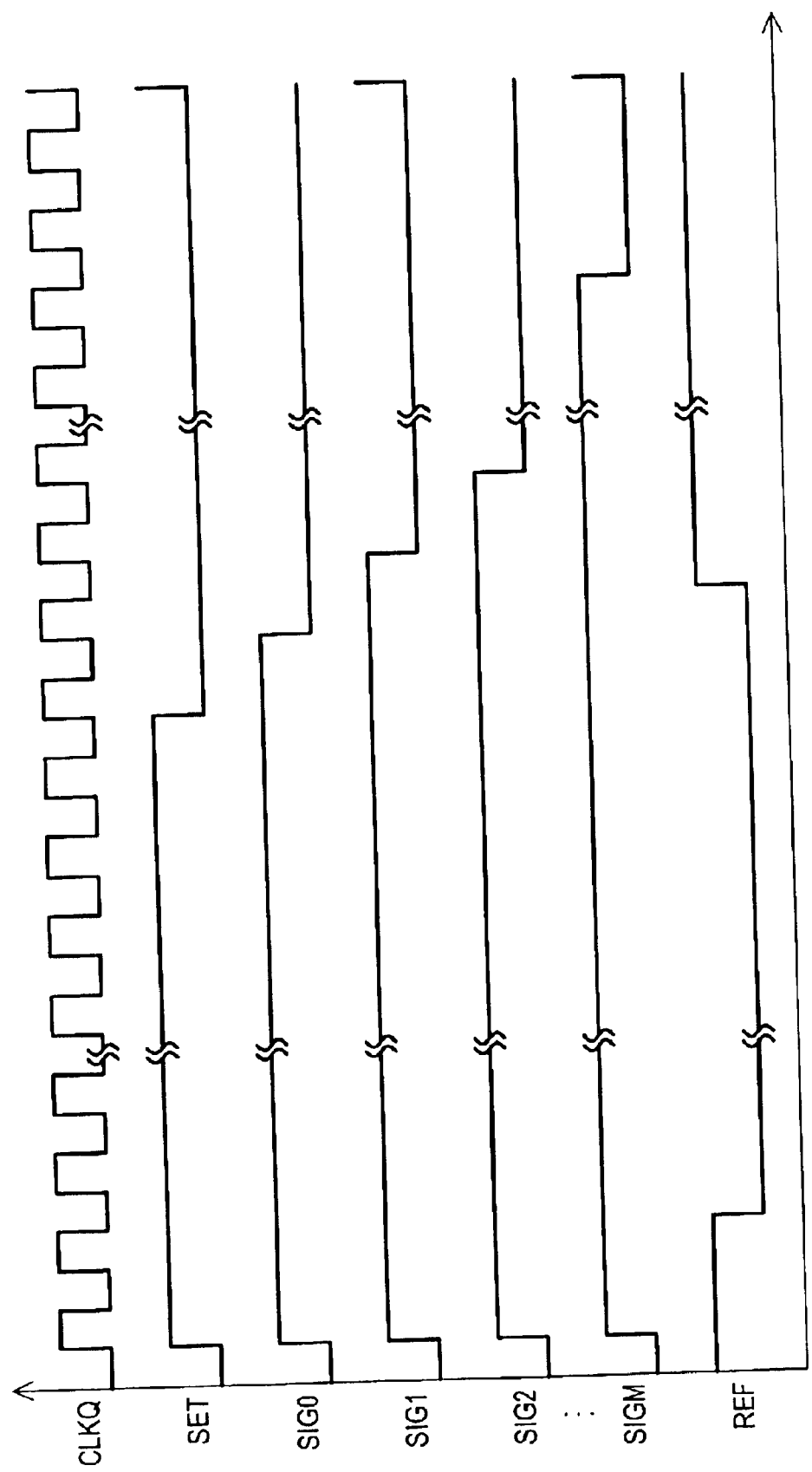
FIG. 9 is a timing diagram showing signals of the conventional PLL circuit set forth in FIG. 8.
Figure 10:
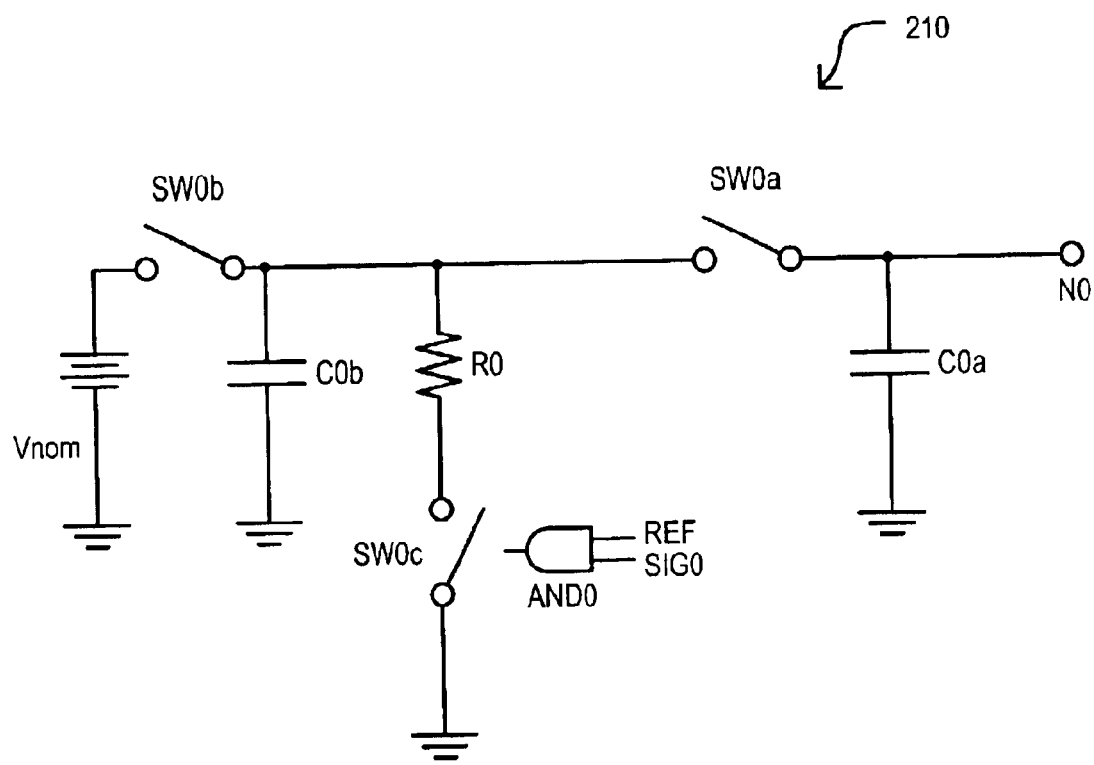
FIG. 10 is a circuit diagram showing a phase difference detection circuit that may be used in the conventional PLL circuit of 8.
Figure 11:
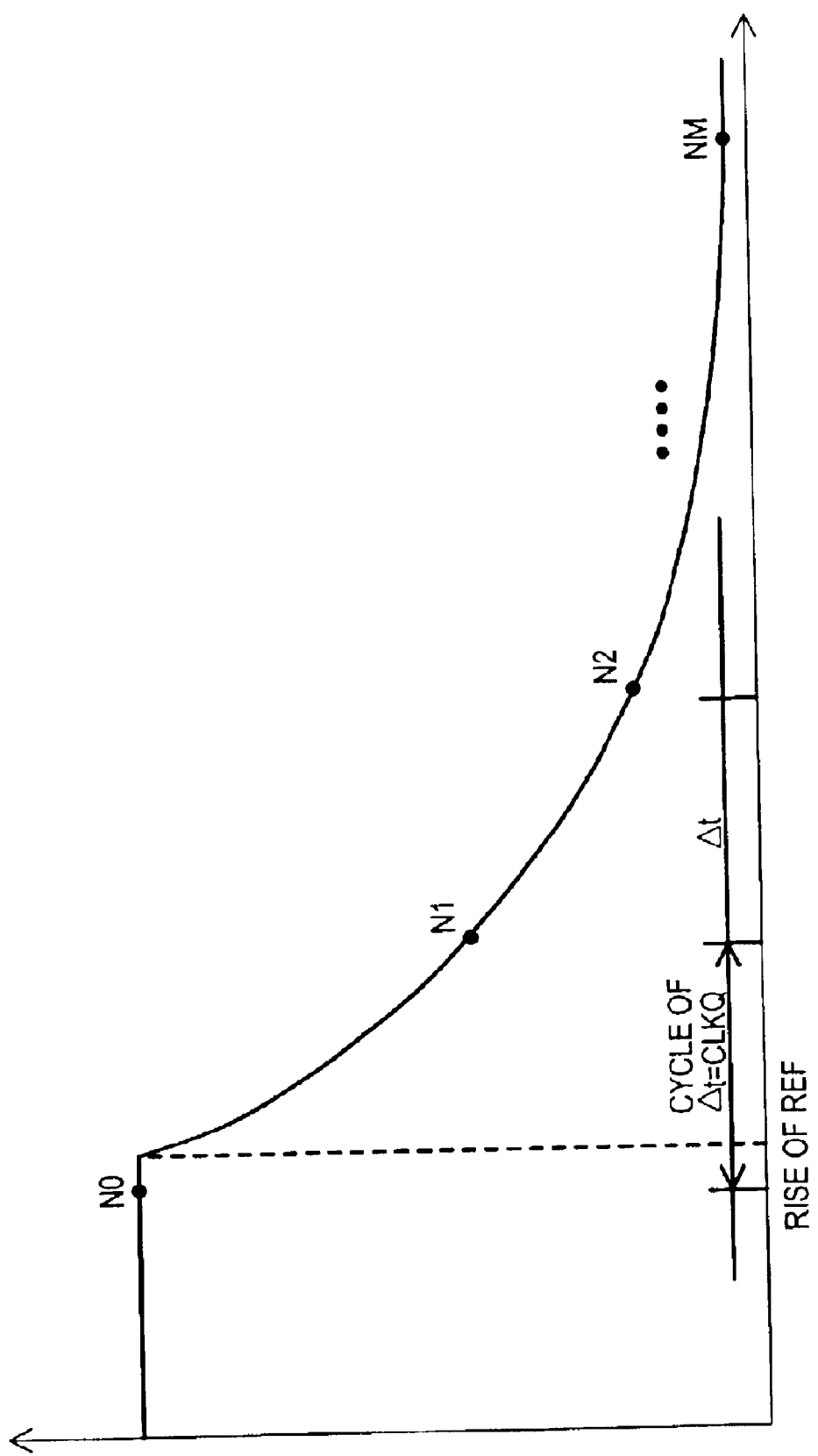
FIG. 11 is a graph showing a potential generated at output nodes (Ni) of a phase difference detection circuit of the conventional PLL circuit of FIG. 8.

FIG. 7 shows one very particular detailed example of a phase detection circuit, such as that shown in FIG. 3. The phase detection circuit of FIG. 7 is designated by the general reference character 101 and can include switches SW1a, SW1b and SW1c, potential holding capacitors C1a and C1b, phase comparison register HT1 for generating a signal HT, logic circuit NOR1 with two inputs, an inverter INV1, and a resistor R1. In one particular arrangement, a capacitance value of potential holding capacitor C1a can have one tenth the capacitance value of potential holding capacitor C1b.

Of course, FIG. 7 represents but one particular embodiment that includes a resistor, capacitors, logic circuits, and the like. Alternate circuit elements may be substituted for those shown. As but one example, while phase comparison register HT1 is shown with one particular circuit configuration, alternate configurations would be understood by those skilled in the art. Such alternate configurations could provide an output signal HT that is high until a main signal SIG rises earlier than the out signal.

While the present invention has been described above according to particular embodiments, a phase comparison method, phase comparison circuit, and PLL circuit of the present invention should not be limited to such particular embodiments. For example, the present invention may include various modifications to such embodiments. As but one very particular example, while examples have been shown in which a phase comparison control unit is provided on a reference signal side, such a unit could also be provided on a main signal side. In addition or alternatively, while embodiments have been illustrated in which potential holding capacitors are discharged, alternate embodiments may include arrangements in which such potential holding capacitors are charged according to combinations of signals generated by a phase difference detection.

As has been described above, in a phase comparison method, phase comparison circuit, and/or PLL circuit according to particular embodiments, phase difference detection circuits, for controlling varactors, can be operated in a sequential fashion according to the threshold voltage of inverter circuits. As a result, a resulting circuit configuration can be simpler than conventional approaches. Thus, even when a relatively large number of varactors are used to enhance the output characteristics of a voltage controlled oscillator with respect to a phase difference, circuit scale and power consumption may be reduced over conventional approaches, as there is no need to generate the same number of signals as varactors. In this way, the number of varactors can be advantageously increased in a voltage controlled oscillator, or the like, without the drawbacks of conventional approaches.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of generating phase comparison signals depending on the phase relationship between a first signal and a second signal, comprising the steps of:
   (a) generating a first voltage signal of a predetermined sequence that has a value that depends on a time elapsed from the activation of the first signal, and activating a first trigger signal of the sequence if the first voltage signal exceeds a threshold limit;
   (b) generating at least one subsequent voltage signal of the sequence having a value that depends on a time elapsed from the activation of a previous trigger signal of the sequence, and activating at least one subsequent trigger signal of the sequence if the at least one subsequent voltage signal exceeds a threshold limit; and
   (c) outputting the first voltage signal and the at least one subsequent voltage signal in response to the second signal as phase comparison signals.

2. The method of claim 1, wherein:
   the step (a) includes activating a first of a plurality of voltage signal generating circuits in the sequence;
   the step (b) includes activating at least one subsequent voltage signal generating circuit of the sequence; and
   the step (c) includes deactivating all of the voltage signal generating circuits.

3. The method of claim 1, further including the step of:
   (d) providing the first and at least subsequent voltage signals to corresponding varactors that each generate a corresponding capacitance, the corresponding capacitances being arranged in parallel.

4. The method of claim 3, further including the step of:
   (e) generating an oscillating signal with a voltage controlled oscillator that includes the parallel connected capacitances, a frequency of the oscillating signal corresponding the parallel connected capacitances.

5. The method of claim 1, wherein:
   step (a) includes discharging a first capacitor to generate the first voltage signal, and activating the first trigger signal if the first voltage signal falls below the threshold limit; and
   step (b) includes discharging at least one subsequent capacitor to generate the at least one subsequent voltage signal, and activating the at least one subsequent trigger signal if the at least one subsequent voltage signal falls below the threshold limit.

6. The method of claim 1, wherein:
   step (a) includes charging a first capacitor to generate the first voltage signal, and activating the first trigger signal if the first voltage signal rises above the threshold limit; and
   step (b) includes charging at least one subsequent capacitor to generate the at least one subsequent voltage signal, and activating the at least one subsequent trigger signal if the at least one subsequent voltage signal rises above the threshold limit.

7. The method of claim 1, wherein:
   step (c) includes transferring the first voltage signal from a first dischargeable capacitor to a first output capacitor, and transferring the at least one subsequent voltage signal from at least one subsequent dischargeable capacitor to at least one subsequent output capacitor.

8. The method of claim 1, wherein:
   the predetermined sequence is greater than two;
   step (b) generates a second subsequent voltage signal of the sequence; and
   step (b) is repeated to generate a third subsequent voltage signal of the sequence.

9. A phase comparison circuit for generating phase comparison signals according to a phase relationship between a first signal and a second signal, comprising:
   a plurality of voltage signal generation circuits each activated in response to corresponding activation signals to generate a voltage signal with a value that depends on a time elapsed from the activation of the corresponding activation signal, and to activate a trigger signal if the voltage signal exceeds a predetermined limit;
   the voltage signal generating circuits having a sequence with a subsequent voltage signal generating circuit being activated in response to the trigger signal of the previous voltage signal generating circuit of the sequence and the first voltage signal generating circuit of the sequence being activated in response to the first signal; and
   deactivating the voltage signal generating circuits in response to the second signal, and outputting the voltage signals of the voltage signal generating circuits as phase comparison signals.

10. The phase comparison circuit of claim 9, wherein:
    each voltage signal generating circuit includes a capacitor having a potential that is set to a predetermined value prior to the activation of the corresponding activation signal, altered in response to the activation of the corresponding activation signal, and output as the voltage signal of the voltage signal generating circuit.

11. The phase comparison circuit of claim 10, further including:
    a signal generation circuit that generates a sample signal followed by a charge signal followed by a deactivation signal; and
    each voltage signal generating circuit sets the capacitor potential to the predetermined value in response to the sample signal, alters the potential in response to charge signal, and outputs the capacitor potential in response to the deactivation signal.

12. The phase comparison circuit of claim 11, wherein:
    the signal generation circuit receives a clock signal and generates the sample signal "a" clock cycles after the activation of the first signal, generates the charge signal "b" cycles after the activation of the first signal, and generates the deactivation signal "c" cycles after the activation of the first signal, where c>b>a.

13. The phase comparison circuit of claim 9, further including:
    a plurality of variable capacitance capacitors connected in parallel with one another having capacitance values the vary according to the phase comparison signals; and
    a voltage controlled oscillator that generates an output signal that oscillates at a frequency which depends upon the parallel connected variable capacitance capacitors.

14. The phase comparison circuit of claim 9, wherein:
each voltage signal generating circuit includes
   a sample capacitor coupled to a voltage node by a first switch,
   a reset capacitor coupled to the voltage node and to a first potential by a second switch,
   a resistance coupled to the voltage node and to a second potential by a third switch, and
   a logic circuit having an input coupled to the voltage node and an output that generates the trigger signal.

15. A phase locked loop circuit, comprising:
a plurality of phase difference detection circuits that each include an enable input and generate an output voltage signal and a trigger signal, the output voltage signal varying according to a time difference between the activation of an enable signal at the enable input and a termination signal common to the phase difference detection circuits; and
the trigger output of one phase difference detection circuit being coupled to the enable input of another phase difference detection circuit.

16. The phase locked loop circuit of claim 15, further including:
   a voltage controlled oscillator (VCO) that varies an output signal frequency according to values received at a plurality of control inputs; and
   each output voltage signal is coupled to one of the VCO control inputs.

17. The phase locked loop circuit of claim 16, wherein:
the VCO control inputs provide control voltage values to varactors.

18. The phase locked loop circuit of claim 15, wherein:
each phase difference detection circuit includes
   a first switch that couples a reset capacitor first node to an output capacitor first node,
   a second switch that couples a first voltage to the reset capacitor first node, and
   a third switch that enables a current path to the reset capacitor first node.

19. The phase locked loop circuit of claim 18, further including:
   a signal generator circuit that activates a sample pulse followed by a reset pulse followed by an end pulse; and
   each phase difference detection includes
      the first switch being activated by the sample pulse,
      the second switch being activated by the reset pulse, and
      the third switch being activated by a logical combination of the end pulse and the signal received at an enable input.

20. The phase locked loop circuit of claim 19, wherein:
the signal generator circuit activates the sample pulse a first number of clock cycles following the activation of a reference signal, activates the reset pulse a second number of clock cycles following the activation of the reference signal, and activates the end pulse a third number of clock cycles following the activation of the reference signal, the third number being greater than the second number, and the second number being greater than the first number.

* * * * *